(12) United States Patent
Lin et al.

(10) Patent No.: US 6,943,113 B1
(45) Date of Patent: Sep. 13, 2005

(54) METAL CHEMICAL POLISHING PROCESS FOR MINIMIZING DISHING DURING SEMICONDUCTOR WAFER FABRICATION

(75) Inventors: Chenting Lin, Poughkeepsie, NY (US); Robert Ploessl, Ithaca, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/569,220

(22) Filed: May 11, 2000

(51) Int. Cl.[7] .................... H01L 21/302; H01L 21/461
(52) U.S. Cl. ................. 438/692; 438/633; 438/691
(58) Field of Search ............................. 438/692, 633, 438/691

(56) References Cited

U.S. PATENT DOCUMENTS

| | | | |
|---|---|---|---|
| 6,218,306 B1 * | 4/2001 | Fishkin et al. | 438/692 |
| 6,261,157 B1 * | 7/2001 | Bajaj et al. | 451/57 |
| 2001/0004538 A1 * | 6/2001 | Li et al. | 438/200 |

\* cited by examiner

Primary Examiner—Caridad Everhart
(74) Attorney, Agent, or Firm—Slater & Matsil, L.L.P.

(57) ABSTRACT

A two-step chemical mechanical polishing (CMP) process is provided to minimize (reduce) dishing of metal lines in trenches in an insulation (oxide) layer of each of a plurality of semiconductor wafers during fabrication thereof. For each wafer, the first step involves CMP of a metal layer disposed on the oxide layer and having a lower portion located in the trenches for forming metal lines and an upper portion overlying the lower portion. The first step polishing uses a first polishing pad to remove the bulk of the metal layer upper portion while generating concomitant CMP residue, and leaves a minimized (reduced) remainder of the metal layer upper portion without dishing of the metal layer lower portion in the trenches. The second step continues the CMP with a second polishing pad to remove the remainder of the metal layer upper portion with minimized (reduced) dishing of the metal layer lower portion to an extent providing the metal lines as individual metal lines in the trenches. Each wafer undergoes the first step polishing with the first polishing pad and then the second step polishing with the second polishing pad. The second polishing pad has at most a deficient content of prior accumulated concomitant CMP residue, e.g., is a relatively fresh (clean) polishing pad.

19 Claims, 2 Drawing Sheets

METAL CHEMICAL POLISHING PROCESS FOR MINIMIZING DISHING DURING SEMICONDUCTOR WAFER FABRICATION

FIELD OF INVENTION

This invention relates to a metal chemical mechanical polishing (CMP) process for minimizing (reducing) dishing during semiconductor wafer fabrication. More particularly, it relates to a process for effectively controlling dishing and erosion during metal CMP of each of a plurality of such wafers, whereby to provide metal lines as individual lines in trenches on an insulation layer substantially without such dishing and/or erosion. As used herein, "semiconductor wafer" means any microelectronic device, substrate, chip or the like, e.g., of silicon, used to provide an integrated circuit or other related circuitry structure, and in particular capable of forming metal lines in an insulation layer thereof.

BACKGROUND OF THE INVENTION

In fabricating microelectronic semiconductor devices and the like on a semiconductor wafer (substrate or chip), e.g., of silicon, to form an integrated circuit (IC), etc., various metal layers and insulation layers are provided in selective sequence on the wafer. To maximize device component integration in the available wafer area to fit more components in the same area, increased IC miniaturization is utilized. Reduced pitch dimensions are used for denser packing of components per very large scale integration (VLSI) technique, e.g., at sub-micron dimensions, i.e., below 1 micron or 1,000 nanometers (nm) or 10,000 angstroms (A).

A metal CMP process is known for providing a damascene (inlaid) pattern, i.e., an arrangement of closely spaced apart individual metal lines, e.g., of aluminum (Al), copper (Cu) or tungsten (W), unconnected to each other and disposed in a like arrangement of closely spaced apart trenches, in an insulation (oxide) layer, e.g., of silicon dioxide ($SiO_2$), in the IC fabrication of a semiconductor wafer, e.g., of silicon (Si).

For instance, the wafer, e.g., a circular disc of about 8 inches (200 mm) diameter, has an aluminum layer disposed on the oxide layer to provide metal lines in the trenches of the oxide layer. The wafer is typically polished by a rotating polishing pad, e.g., of about 20 inches diameter, such as of polyurethane fibrous plastic sheeting material, e.g., at about 20–100 rpm, such as about 50 rpm, e.g., under a polishing pressure downforce of about 2–8 psi, such as about 5 psi, e.g., for a polishing time of about 35–350 seconds, such as about 160 seconds, to an extent for forming the metal lines as individual lines in the trenches.

The metal CMP is effected while feeding onto the polishing pad an aqueous slurry of colloidal abrasive polishing particles, e.g., of alumina ($Al_2O_3$), and an associated oxidizer in water, e.g., at a flow rate of about 100–300 sccm (standard cubic centimeters per minute), such as about 200 sccm.

As the polishing progresses, the layer material being polished is locally incrementally removed, i.e., by chemical etching and mechanical abrasion, with the generation of debris constituting a concomitant CMP residue comprising a mixture of solid fine particles and liquid reaction products. The fine particles of the polishing debris or residue are traceable to the attendant metal layer material, insulation layer material and/or abrasive polishing particle material, and are generally fractured colloidal particles that are abrasive in nature. The liquid reaction products are traceable to the oxidizer and include chemical substances that are etchant in nature and prone to layer material etching.

After the metal CMP is completed, the wafer typically undergoes a water polishing step to remove the concomitant CMP residue. Then, the CMP operation is repeated for the next wafer. However, some of the concomitant CMP residue accumulates incrementally on the polishing pad, e.g., of polyurethane fibrous plastic sheeting material, during the CMP operation for each wafer, which progressively increasingly loads the polishing pad with such CMP residue despite the water polishing step applied to each wafer after it has been subjected to metal CMP.

Typically, each of a plurality of wafers, e.g., 25 wafers, comprising a first lot, is subjected respectively to the metal CMP operation (including the water polishing step), followed by a further plurality of wafers, e.g., 25 more wafers, comprising a second lot, and then a still further plurality of wafers, e.g., 25 additional wafers, comprising a third lot. After 3 such lots of wafers, e.g., 75 wafers, have been processed in succession, the concomitant CMP residue loaded polishing pad is normally replaced by a fresh (clean) polishing pad, and the next cycle of 3 lots is subjected to the metal CMP operation.

Experience has shown that at most about 3 lots of wafers, e.g., about 75 wafers, can be adequately polished by the same polishing pad because of the progressive incremental loading of concomitant metal CMP residue thereon. Indeed, for wafers of the same lot, it is recognized that the ones that are last to be polished suffer from more severe dishing and erosion than the earlier ones, given the progressive increase of such metal CMP residue loading on the polishing pad and its abrasive and etchant effects on the wafers.

In particular, the so-polished wafers usually suffer from attendant dishing in the damascene pattern area containing the metal lines in the trenches, plus erosion of adjacent portions of the oxide layer. Dishing is the formation of a concave depression, e.g., in the arrangement of metal lines in the trenches, which occurs during metal CMP. Erosion is the associated non-uniform (uneven) removal of, e.g., oxide, layer material, locally or globally, which also occurs during the metal CMP operation.

Dishing adversely affects the sheet resistance (RS) performance of each metal line. In this regard, RS, for a given width of metal line, is the quotient of the resistivity of the metal material divided by the metal line thickness (height) and is a measure of the amount of current the line can carry. Such metal line height decreases as the dishing depth increases. The smaller the metal line cross sectional area, the smaller the current the line can carry. Thus, dishing during metal CMP results in undesired high resistivity of the eventual metal structure produced.

Erosion adversely affects the performance characteristics of subsequent (higher) metallization levels. Erosion introduces non-planarity onto the wafer surface which results in difficultly removable metal puddles consequent metallization operations at higher levels, and can cause electrical shorting between adjacent metal lines, e.g., in an upper level damascene arrangement.

It is desirable to have a metal CMP process for forming closely spaced apart metal lines as individual metal lines in trenches in an insulation layer of each of a plurality of semiconductor wafers, which minimizes (reduces) resultant dishing and erosion, without requiring additional consumable materials beyond those normally used and without significantly reducing wafer throughput or product yield.

SUMMARY OF THE INVENTION

The foregoing drawbacks are obviated in accordance with the present invention by providing a metal chemical mechanical polishing (CMP) process for forming closely spaced apart metal lines as individual metal lines in trenches in an insulation layer of each of a plurality of semiconductor wafers, which minimizes (reduces) resultant dishing and erosion during fabrication thereof, without requiring additional consumable materials beyond those normally used and without significantly reducing wafer throughput or product yield.

According to the invention, a CMP process for minimizing dishing of metal lines formed in trenches in an insulation layer of each of a plurality of semiconductor wafers during fabrication thereof, comprises for each wafer:

a first, bulk polishing, step of chemically mechanically polishing a metal layer disposed on the insulation layer of the corresponding wafer and having a lower portion located in the trenches of the insulation layer for forming individual metal lines and an upper portion overlying the lower portion; and a second, overpolishing, step.

The first, bulk polishing, step polishing is effected with a first polishing pad sufficiently to remove the bulk of the upper portion of the metal layer while generating concomitant chemical mechanical polishing residue, and to leave a minimized remainder of the metal layer upper portion substantially without dishing of the metal layer lower portion in the trenches.

The second, overpolishing, step involves continuing the polishing with a second polishing pad sufficiently to remove the remainder of the metal layer upper portion with attendant minimized (reduced) dishing of the metal layer lower portion to an extent for providing the metal lines as individual metal lines correspondingly disposed in the trenches.

Each of the wafers is subjected to the first step polishing with the first polishing pad and thereafter to the second step polishing with the second polishing pad. Significantly, the second polishing pad has at most a substantially deficient content of prior accumulated chemical mechanical polishing residue, i.e., is a relatively fresh (clean) polishing pad.

In turn, each of a further plurality of said wafers is subjected to said first and second steps, using said second polishing pad for said first polishing step and a third polishing pad for said second step. The third polishing pad also has at most a substantially deficient content of prior accumulated chemical mechanical polishing residue, i.e., is a relatively fresh (clean) polishing pad.

Desirably, each wafer comprises silicon, the insulation layer comprises silicon dioxide, and the metal layer comprises aluminum, copper or tungsten. Typically, the insulation layer has a thickness of at least about 300 nm and the metal layer has a thickness of about 200–2000 nm. Preferably, the first step is effected at a downforce of about 2–8 psi for about 30–300 seconds and the second step is effected at a downforce of about 2–8 psi for about 5–50 seconds.

Optionally, yet desirably, a stop layer forming an adhesion promoting diffusion barrier, such as a stop layer of titanium/titanium nitride (Ti/TiN), is disposed between the insulation layer and the metal layer. Typically, the stop layer has a thickness of about 5–200 nm.

In accordance with a preferred embodiment of the invention, the CMP process comprises for each wafer:

a first, bulk polishing, step of chemically mechanically polishing a metal layer disposed on the insulation layer of the corresponding wafer and having a lower portion located in the trenches of the insulation layer for forming individual metal lines and an upper portion overlying the lower portion, a stop layer forming an adhesion promoting diffusion barrier being disposed between the insulation layer and the metal layer and extending into the trenches;

the first step polishing being effected with a first polishing pad sufficiently to remove the bulk of the upper portion of the metal layer while generating concomitant chemical mechanical polishing residue, and to leave a minimized remainder of the metal layer upper portion, and to expose the portion of the stop layer outwardly of the trenches, substantially without dishing of the metal layer lower portion in the trenches; and a second, overpolishing, step of continuing the polishing with a second polishing pad sufficiently to remove the remainder of the metal layer upper portion with attendant minimized dishing of the metal layer lower portion to an extent for providing the metal lines as individual metal lines correspondingly disposed in the trenches.

In this case, each of the wafers is subjected to the first step polishing with the first polishing pad and thereafter to the second step polishing with the second polishing pad, and additionally each of a further plurality of said wafers is subjected to said first and second steps, using said second polishing pad for said first polishing step and a third polishing pad for said second step. Each wafer is subjected to a third polishing step of chemically mechanically polishing the stop layer to remove the portion thereof outwardly of the trenches. Significantly, the second polishing pad and the third polishing pad each has at most a substantially deficient content of prior accumulated chemical mechanical polishing residue.

Typically, each of a still further plurality of said wafers is subjected to said first and second steps, using said third polishing pad for said first polishing step and a fourth polishing pad for said second step, with the fourth polishing pad also having at most a substantially deficient content of prior accumulated chemical mechanical polishing residue.

The present invention also contemplates the corresponding wafer products formed by the above-noted processing.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1A:
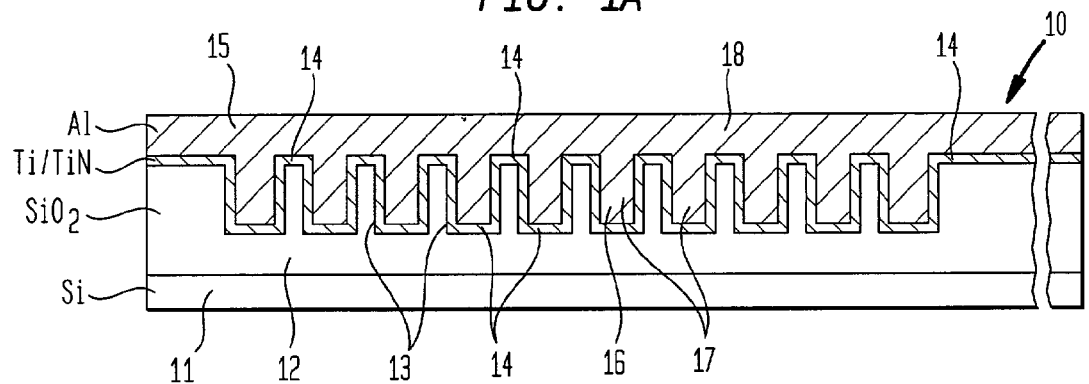
FIGS. 1A to 1C are a series of side sectional views showing conventional stages in forming a semiconductor wafer having an insulation layer containing trenches on which a metal layer is disposed for forming metal lines in the trenches, with pronounced attendant dishing and erosion.
Figure 1B:
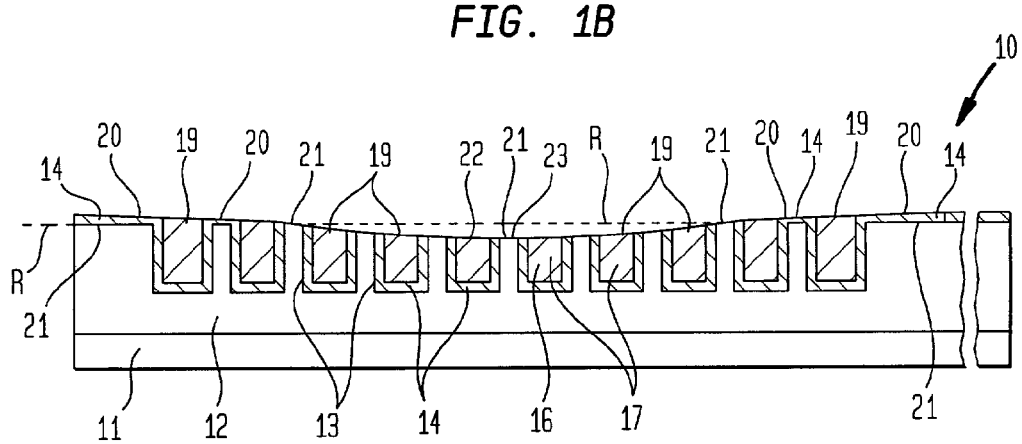
Figure 1C:
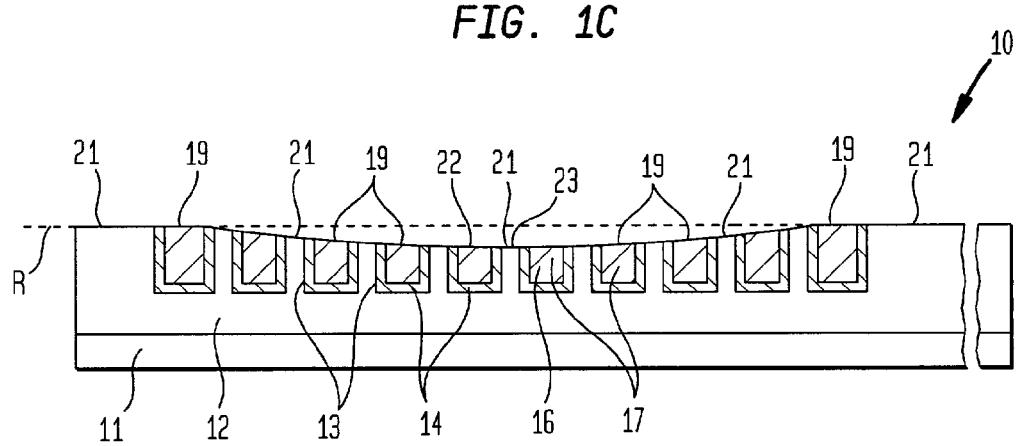

Referring now to FIGS. 1A to 1C, a series of side sectional views is shown of conventional stages in forming a semiconductor wafer 10. Wafer 10 has a base 11, an insulation layer 12, trenches 13, a stop layer 14, a metal layer 15, a metal layer lower portion 16, metal lines 17 and a metal layer upper portion 18 (FIG. 1A), plus a metal line surface 19, a stop layer surface 20, an oxide layer surface 21, a dishing formation 22, an erosion formation 23 and a reference plane R (FIGS. 1B to 1C).

Referring now to FIG. 1A, wafer 10 is typically of circular disc shape with a diameter of about 8 inches (200 mm) and formed of silicon. It includes a base 11, e.g., of silicon, covered by an insulation (oxide) layer 12, e.g., of silicon dioxide, as interlayer dielectric, e.g., having a thickness of at least about 300 nm (0.3 micron), such as about 500 nm, which is provided with a damascene pattern area containing an arrangement of trenches 13. Metal layer 15, e.g., of aluminum, e.g., having a thickness of about 200–2000 nm (0.2–2 microns), such as about 300 nm, is disposed on oxide layer 12.

Stop layer 14, e.g., of titanium/titanium nitride (Ti/TiN), e.g., having a thickness of about 5–2000 nm (0.005–2 microns), such as about 50 nm, is optionally, yet desirably, interposed between oxide layer 12 and metal layer 15 as a conventional temporary adhesion promoting diffusion barrier.

A trench arrangement comprises a group of closely spaced apart trenches 13 formed in oxide layer 12 which are filled with the lower portion 16 of metal layer 15 to form a corresponding metal line arrangement comprising a group of closely spaced apart metal lines 17 embedded in trenches 13, and at this point still contiguous with the overlying upper portion 18 of metal layer 15.

FIG. 1A represents a typical wafer prior to subjecting it to the conventional metal CMP process.

Referring now to FIG. 1B, there is shown a side sectional view of wafer 10 of FIG. 1A after completing the one-step first stage of the conventional metal CMP operation for forming individual metal lines 17 from metal layer lower portion 16. In FIG. 1B, items 11 to 14 and 16 to 17 are the same as those in FIG. 1A. FIG. 1B also includes metal line surface 19, stop layer surface 20, oxide layer surface 21, dishing formation 22, erosion formation 23, and a reference plane R.

It is seen that the usual one-step first stage metal CMP removes the overlying upper portion 18 of metal layer 15 to expose stop layer surface 20 and form individual metal lines 17 having a metal line surface 19 from corresponding portions of lower portion 16 of metal layer 15 in trenches 13. However, this also causes partial exposure of oxide layer surface 21 and attendant erosion of oxide layer 12. As a result, relative to reference plane R, a pronounced attendant dishing formation 22 is produced in metal lines 17 and a corresponding erosion formation 23 is produced in oxide layer 12.

This one-step first stage metal CMP is effected with a rotating polishing pad, e.g., of about 20 inches diameter, such as of polyurethane fibrous plastic sheeting material, e.g., at about 20–100 rpm, such as about 50 rpm, e.g., under a polishing pressure downforce of about 2–8 psi, such as about 5 psi, e.g., for a polishing time of about 35–350 seconds, such as about 160 seconds, while feeding onto the polishing pad an abrasive slurry, i.e., an aqueous slurry of colloidal abrasive polishing particles, e.g., of alumina ($Al_2O_3$), and an associated oxidizer in water, e.g., at a flow rate of about 100–300 sccm, such as about 100 sccm.

Referring now to FIG. 1C, there is shown a side sectional view of wafer 10 of FIG. 1B after completing the second stage of the conventional CMP operation in which the exposed portion of stop layer 14 is removed. In FIG. 1C, items 11 to 14, 16 to 17, 19, 21 to 23 and R are the same as those in FIG. 1B. It is seen that the second stage of the CMP operation removes the remaining exposed portion of stop layer 14, i.e., outwardly (externally) of trenches 13, and completely exposes oxide layer surface 21.

At this point, as is clear from FIG. 1C, metal lines 17 are not only unconnected to each other through the (now removed) overlying metal layer upper portion 18, but also unconnected to each other through the (now removed) adjacent exposed portion of stop layer 14 outwardly of trenches 13, thereby preventing electrical shorting among metal lines 17.

The second stage CMP operation is effected with a different rotating polishing pad under conventional conditions, using a different abrasive slurry, i.e., a different aqueous slurry of colloidal abrasive polishing particles, e.g., of silica ($SiO_2$), and an associated oxidizer in water.

The aqueous slurry of colloidal abrasive polishing particles and associated oxidizer used for the first stage of the CMP operation is designed to remove preferentially and rapidly metal layer upper portion 18 without significantly removing the exposed portions of stop layer 14 or oxide layer 12. On the other hand, the aqueous slurry of colloidal abrasive particles and associated oxidizer used for the second stage of the CMP operation is designed to remove preferentially and rapidly the exposed portions of stop layer 14 without significantly removing metal layer lower portion 16 or the exposed portions of oxide layer 12.

However, due to the progressive accumulation of generated concomitant CMP residue, i.e., of abrasive particles and etchant liquids, as noted above, on the polishing pad in the metal CMP one-step first stage, the corresponding wafers typically progressively undergo pronounced attendant dishing of the damascene arrangement of metal lines 17 formed in trenches 13 as well as pronounced attendant erosion of the portion of oxide layer 12 adjacent trenches 13.

This is because for proper metal CMP to be effected, it is essential that the polishing action be continued after stop layer 14 is initially exposed (FIG. 1B), for sufficient overpolishing to insure that all residual metal from upper portion 18 of metal layer 15 is removed. Such residual metal is traceable to non-planarity, locally and/or globally, that may exist in the given wafer 10 outwardly (externally) of the embedded structure, i.e., the arrangement of trenches 13 containing metal layer lower portion 16.

Such residual metal must be completely removed by sufficient overpolishing to avoid possible electrical shorting between adjacent damascene metal lines 17, formed in trenches 13 from metal layer lower portion 16, via still contiguous residual portions of metal layer upper portion 18 (and in turn via still remaining portions of stop layer 14 outwardly of trenches 13).

Dishing and erosion occur mostly during the overpolishing terminal segment of the one-step first phase of the metal CMP operation. This is because metal layer lower portion 16 which forms the embedded metal structures, i.e., metal lines 17 in the damascene pattern of trenches 13, and stop layer 14 are no longer protectively covered by metal layer upper portion 18, but rather are directly exposed to the abrasive action of the aqueous slurry and concomitant CMP polishing residue during rotation of the polishing pad under the applied polishing pressure downforce (cf. FIGS. 1A and 1B).

As noted above, for wafers of the same lot, it is recognized that the ones that are polished later in succession are subjected to more severe dishing and erosion than those polished earlier in succession. However, the correlation of polishing sequence and differential extent of dishing and erosion cannot be attributed to mechanical aging (extent of wear) of the polishing pad used in the metal CMP cycle, since a worn pad, packed (loaded) with CMP residue, is inherently less conforming than a relatively fresh (clean) pad, and thus should cause less dishing and erosion of metal layer lower portion 16 and oxide layer 12 in the damascene pattern of trenches 13.

While the matter is not completely understood at this time, it is believed that the increased dishing and erosion consequent the one-step first phase metal CMP operation is caused by the above explained accumulation of concomitant CMP residue as a result of progressive polishing pad loading.

In the alternative case in which stop layer 14 is omitted, the second phase of the CMP operation is also omitted. Instead, the overpolishing terminal segment of the one-step first phase of the CMP operation is correspondingly continued after oxide layer 12 is initially exposed to insure that all residual metal from upper portion 18 of metal layer 15 is removed. As noted above, such residual metal must be completely removed by sufficient overpolishing to avoid possible electrical shorting between adjacent damascene metal lines 17, formed in trenches 13 from metal layer lower portion 16, via still contiguous residual portions of metal layer upper portion 18.

In this alternative case, dishing and erosion similarly occur mostly during the overpolishing terminal segment of the one-step first phase of the metal CMP operation because metal layer lower portion 16 and oxide layer 12 in the damascene pattern of trenches 13 are no longer protectively covered by metal layer upper portion 18, and oxide layer 12 is not protectively covered by a stop layer. Instead, at this point both metal layer lower portion 16 and oxide layer 12 are directly exposed to the abrasive action of the aqueous slurry and concomitant CMP polishing residue during rotation of the polishing pad under the applied polishing pressure downforce.

In contrast to the above described known metal CMP process, in accordance with the invention, an effective two-step first phase metal CMP system is provided for reducing or minimizing such dishing and erosion in essence by reducing the debris load (accumulation of concomitant CMP residue) on the polishing pad before the metal layer lower portion 16 and oxide layer 12 are exposed by the metal CMP operation. This is achieved by changing from a concomitant CMP residue loaded polishing pad to a polishing pad having at most a substantially deficient content of prior accumulated concomitant CMP residue, i.e., by changing to a relatively fresh (clean) polishing pad.

Figure 2A:
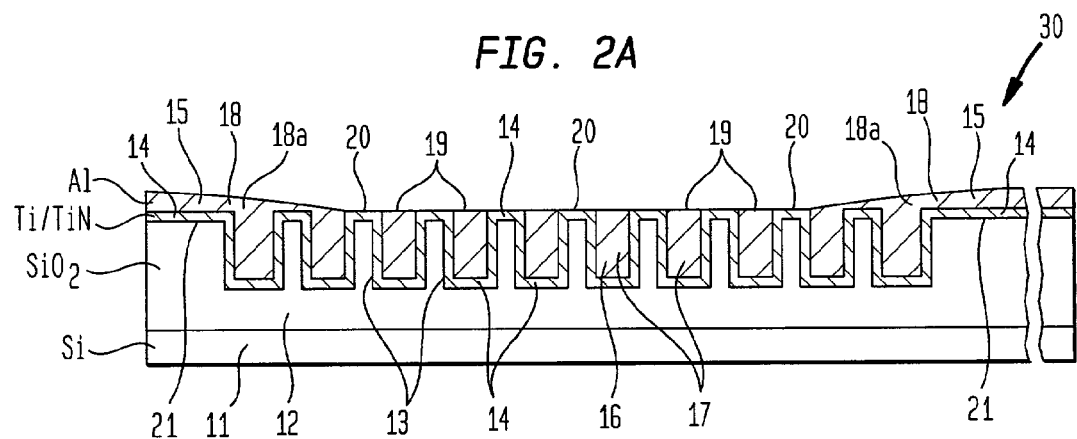
FIGS. 2A to 2C are a series of side sectional views, analogous to FIGS. 1B to 1C, showing stages according to the process of the invention in forming such a semiconductor wafer starting from the wafer shown in FIG. 1A, with minimized (reduced) attendant dishing and erosion.
Figure 2B:
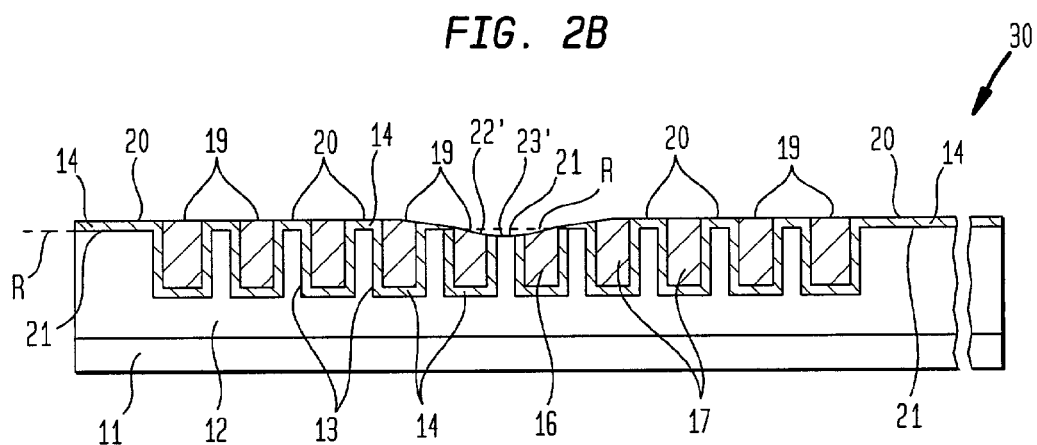
Figure 2C:
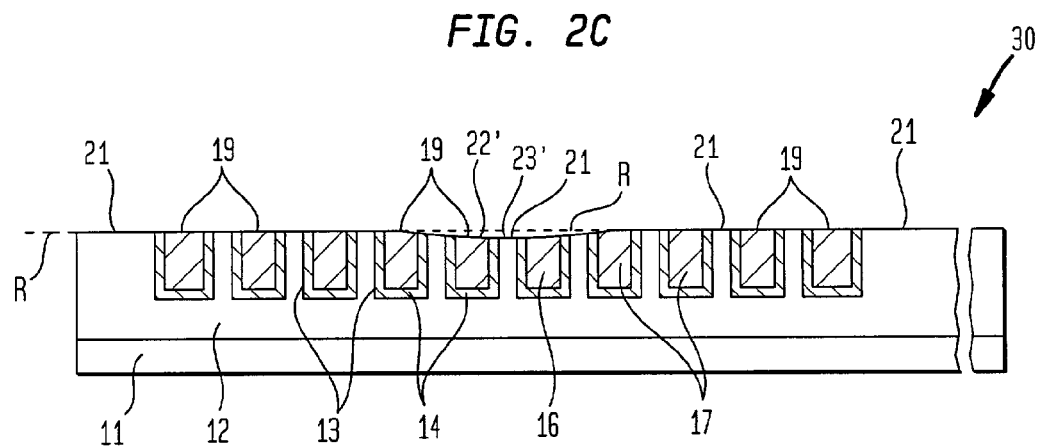

Referring now to FIGS. 2A to 2C, a series of side sectional views, analogous to FIGS. 1B to 1C, is shown of stages according to the process of the invention in forming a semiconductor wafer 30 starting from wafer 10 shown in FIG. 1A, with minimized (reduced) attendant dishing and erosion.

Referring now to FIG. 2A, items 11 to 21 are the same as those in FIGS. 1A and 1B, as the case may be. FIG. 2A also includes a residual metal layer upper portion 18a. FIG. 2A shows the condition of wafer 30 after the bulk polishing first step of the two-step first phase of the metal CMP operation according to the process of the invention.

To this end, wafer 10 of FIG. 1A is subjected to the bulk polishing first step of the two-step first stage metal CMP process of the invention using a first rotating polishing pad, e.g., of about 20 inches diameter, such as of polyurethane fibrous plastic sheeting material, e.g., at about 20–100 rpm, such as about 50 rpm, e.g., under a polishing pressure downforce of about 2–8 psi, such as about 5 psi, e.g., for a first step bulk polishing time of about 30–300 seconds, such as about 135 seconds, while feeding onto the polishing pad an abrasive slurry, i.e., an aqueous slurry of colloidal abrasive polishing particles, e.g., of alumina ($Al_2O_3$), and an associated oxidizer in water, e.g., at a flow rate of about 100–300 sccm, such as about 100 sccm.

This first, bulk polishing, step is effected for a time and in a manner sufficient to remove the bulk of metal layer upper portion 18 of metal layer 15 and to leave a minimized (reduced) remainder thereof, i.e., residual metal layer upper portion 18a, while generating a corresponding bulk (major or large) amount of concomitant CMP polishing residue, yet substantially without dishing and erosion. At this point, metal line surface 19 of metal lines 17 of metal layer lower portion 16 in trenches 13 is exposed as well as the main portion of stop layer surface 20, while a minor portion of stop layer 14 remains covered by residual metal layer upper portion 18a of metal layer upper portion 18, whereas oxide layer surface 21 is still completely covered by stop layer 14.

Referring now to FIG. 2B, there is shown a side sectional view of wafer 30 of FIG. 2A, after completing the second, overpolishing, step of the two-step first stage of the metal CMP operation according to the invention for forming individual metal lines 17 from metal layer lower portion 16. In FIG. 2B, items 11 to 17 and 19 to 21 are the same as those in FIG. 2A. FIG. 2B also includes a dishing formation 22' and an erosion formation 23', plus a reference plane R.

To this end, wafer 30 of FIG. 2A is subjected to the overpolishing second step of the two-step first stage metal CMP process of the invention using a second rotating polishing pad, e.g., of about 20 inches diameter, such as of polyurethane fibrous plastic sheeting material, which is relatively fresh (clean), i.e., a polishing pad having at most a substantially deficient content of prior accumulated CMP residue, and preferably a clean (new) polishing pad.

The second rotating polishing pad is used, e.g., at about 20–100 rpm, such as about 50 rpm, e.g., under a polishing pressure downforce of about 2–8 psi, such as about 5 psi, e.g., for a second step overpolishing time of about 5–50 seconds, such as about 25 seconds, while feeding onto the polishing pad an abrasive slurry, i.e., an aqueous slurry of colloidal abrasive polishing particles, e.g., of alumina ($Al_2O_3$), and an associated oxidizer in water, e.g., at a flow rate of about 100–300 sccm, such as about 100 sccm.

This second, overpolishing, step contemplates continuing the polishing action of the first, bulk polishing, step for a time and in a manner sufficient to remove the minimized (reduced) remainder of metal layer upper portion 18, i.e., residual metal layer upper portion 18a, while generating a corresponding overpolishing (minor or small) amount of concomitant CMP polishing residue, with attendant minimized (reduced) dishing and erosion. The second, overpolishing, step is effected to an extent for providing metal lines 17 in metal layer lower portion 16 in trenches 13 as individual metal lines correspondingly disposed in the trenches.

As noted above, such remainder of metal layer upper portion 18 must be completely removed by sufficient overpolishing to avoid possible electrical shorting between adjacent damascene metal lines 17, formed in trenches 13 from metal layer lower portion 16, via still contiguous residual portions of metal layer upper portion 18 (and in turn via still remaining portions of stop layer 14 outwardly of trenches 13).

At this point, the entire surface 20 of stop layer 14 is exposed since residual metal layer upper portion 18a of metal layer upper portion 18 has been completely removed. A slight portion of stop layer 14 is also removed to expose oxide layer surface 21 of oxide layer 12 adjacent some trenches 13, a slight portion of which oxide layer 12 is also removed (eroded). It is seen from FIG. 2B that metal line surface 19 of metal lines 17 formed from metal layer lower portion 16 in trenches 13 contains only a minimized dishing formation 22' and oxide layer 12 adjacent trenches 13 concomitantly contains only a minimized erosion formation 23', relative to reference plane R.

Thus, the two-step first stage metal CMP according to the invention removes the overlying upper portion 18 of metal layer 15 to expose stop layer surface 20 and form individual metal lines 17 from corresponding portions of lower portion 16 of metal layer 15, with the production of only a minimized attendant dishing formation 22' (as compared to 22 of FIG. 1B), plus a concomitant minimized erosion formation 23' (as compared to 23 of FIG. 1B).

In a typical embodiment, the total polishing time of 135+25=160 seconds of the two-step CMP process according to the invention is generally the same as the 160 second total polishing time of the one-step prior art CMP process, as discussed above. On the other hand, the pronounced dishing and erosion attendant the one-step prior art CMP process is avoided according to the invention by utilizing a relatively short adjunct or second step with a relatively fresh (clean) polishing pad, instead of using a single pad throughout a continuous and relatively prolonged one-step first phase CMP operation as in the prior art.

This relatively short adjunct or second step of the first phase of the metal CMP process of the invention, which follows the relatively prolonged first, bulk polishing, step, serves to clean up the residual metal 18a of metal layer upper portion 18 outside of metal layer lower portion 16 in trenches 13 so as to form metal lines 17 as individual metal lines in the arrangement of trenches 13. During this relatively short adjunct or second step, the load of concomitant CMP residue on the now relatively fresh second polishing pad is considered to be minimal, compared to the load thereof on the first polishing pad used for the relatively prolonged first step, and thus the exposed metal lines 17 of layer lower portion 16 in trenches 13 are subjected to dishing and erosion effects to only a minor (small) extent.

Advantageously, the two-step first phase metal CMP process of the invention achieves the desired polished wafer result without requiring additional consumable materials beyond those otherwise needed, nor does it reduce wafer throughput or product yield to any significant extent.

Referring now to FIG. 2C, there is shown a side sectional view of wafer 30 of FIG. 2B, after completing the second stage (third step per the process of the invention) of the CMP operation in which the exposed portion of stop layer 14 is removed. In FIG. 2C, items 11 to 14, 16 to 17, 19, 21, 22', 23' and R are the same as those in FIG. 2B. It is seen from FIG. 2C that, like the case of FIG. 1C, the second stage of the CMP operation according to the invention completely removes the exposed portion of stop layer 14, i.e., outwardly of trenches 13, and exposes oxide layer surface 21.

At this point, as is clear from FIG. 2C, metal lines 17 are not only unconnected to each other through the (now removed) overlying metal layer upper portion 18, but also unconnected to each other through the (now removed) adjacent exposed portion of stop layer 14 outwardly of trenches 13, thereby preventing electrical shorting among metal lines 17.

Here also, the second stage CMP operation is effected with a different rotating polishing pad under conventional conditions, using a different abrasive slurry, i.e., a different aqueous slurry of colloidal abrasive polishing particles, e.g., of silica ($SiO_2$), and an associated oxidizer in water. As noted above, the aqueous slurry of colloidal abrasive polishing particles and associated oxidizer used for the first stage of the CMP operation is designed to remove preferentially and rapidly metal layer upper portion 18 without significantly removing the exposed portions of stop layer 14 or oxide layer 12, whereas the aqueous slurry of colloidal abrasive particles and associated oxidizer used for the second stage of the CMP operation is designed to remove preferentially and rapidly the exposed portions of stop layer 14 without significantly removing metal layer lower portion 16 or the exposed portions of oxide layer 12.

Again, in the alternative case in which stop layer 14 is omitted, the second phase (third step per the process of the invention) of the CMP operation is also omitted. Instead, the second, overpolishing, step of the first phase of the CMP operation is continued after oxide layer 12 is initially exposed to insure that all residual metal from upper portion 18 of metal layer 15 is removed to avoid possible electrical shorting between adjacent damascene metal lines 17, formed in trenches 13 from metal layer lower portion 16, via still contiguous residual portions of metal layer upper portion 18.

In this alternative case, dishing and erosion similarly occur mostly during the second, overpolishing, step of the first phase of the metal CMP operation because the metal layer lower portion 16 and formed metal lines 17 in the damascene pattern of trenches 13 are no longer protectively covered by metal layer upper portion 18, and oxide layer 12 is not protectively covered by a stop layer. Instead, at this point both such metal layer lower portion 16 and oxide layer 12 are directly exposed to the abrasive action of the aqueous slurry and concomitant CMP polishing residue during rotation of the polishing pad under the applied polishing pressure downforce.

According to the invention, use of the first polishing pad is changed to use of the second polishing pad at the initial exposure of stop layer 14 (FIG. 2A), i.e., at the initial exposure of metal lines 17 of metal layer lower portion 16 in trenches 13, e.g., as concomitantly indicated by polishing pad turntable current traces in conventional manner, or by other known detection technique such as polishing time intervals, polishing pad temperature change upon reaching the exposed surface of stop layer 14, and the like.

According to the invention, the first, bulk polishing, step may be carried out for each wafer respectively in a first conventional CMP apparatus (not shown) using the first polishing pad, and the second, overpolishing, step may be carried out for each wafer respectively in a like second conventional CMP apparatus (not shown) using the second polishing pad.

In this way, during the adjunct or second, overpolishing, step of the first phase of the CMP process, the plurality of wafers, each of which has been previously subjected to the first, bulk polishing, step of the first phase of the CMP process, using the first polishing pad in the first CMP apparatus, may each respectively be switched to the second CMP apparatus and subjected to the second, comparatively fresh (clean) polishing pad with at most minimal prior loading, i.e., having at most a substantially deficient content of prior accumulated concomitant CMP residue, so as to promote minimal dishing and erosion in connection with the production of individual metal lines 17 from metal layer lower portion 16 in trenches 13 (FIG. 2B).

Indeed, during the second, overpolishing, step of the first phase of the CMP process of the invention, only the residual metal 18a of metal layer upper portion 18 of metal layer 15 is removed, as indicated in FIG. 2B compared to FIG. 2A. Hence, the loading of the second polishing pad occurs under milder conditions, i.e., at a much slower (lower) removal rate during the short second, overpolishing, step, e.g., of about 25 seconds polishing time per wafer, than the faster (higher) removal rate loading of the first polishing pad during the prolonged first, bulk polishing, step, e.g., of about 135 seconds per wafer.

With only a minor (small) incremental loading on the second polishing pad, the contemplated water polishing step normally undertaken at the end of the second, overpolishing, step for a given wafer promotes removal of a large percentage of concomitant CMP residue therefrom before the next wafer, e.g., of a plurality of wafers in a lot being processed, is subjected to the second, overpolishing, step. In turn, this water polishing step removal of a large percentage of the concomitant CMP residue aids in minimizing the rate of loading of accumulated concomitant CMP residue on the second polishing pad in the CMP processing of a given plurality of wafers, i.e., a given number of wafer lots, e.g., 3 lots, each containing 25 wafers.

After the second polishing pad has been used in the short second, overpolishing, step to process the contemplated number of wafer lots, e.g., 3 lots, each containing 25 wafers, totalling 75 wafers (lots 1 to 3), the first polishing pad, now substantially loaded with accumulated CMP residue, may be efficiently replaced on the first CMP apparatus by the second polishing pad for use in the prolonged first, bulk polishing, step, and a third polishing pad having at most a substantially deficient content of prior accumulated CMP residue, e.g., a comparatively fresh (clean) polishing pad, may be used on the second CMP apparatus in place of the second polishing pad for the short second, overpolishing, step, in connection with the processing of subsequent wafer lots, e.g., 3 more lots, totalling 75 wafers (lots 4 to 6).

Thereafter, the second polishing pad, in turn now substantially loaded with accumulated CMP residue, may be replaced on the first CMP apparatus by the third polishing pad for use in the prolonged first, bulk polishing, step, and a fourth polishing pad having at most a substantially deficient content of prior accumulated CMP residue, e.g., a comparatively fresh (clean) polishing pad, may be used on the second CMP apparatus in place of the third polishing pad for the short second, overpolishing, step, as to the processing of further wafers, e.g., 3 more lots, totalling 75 wafers (lots 7 to 9).

Alternatively, after the first polishing pad has become substantially loaded with accumulated CMP residue, e.g., after 3 lots, totalling 75 wafers (lots 1 to 3), have been subjected to the first, bulk polishing, step), the first polishing pad may be replaced by the third polishing pad on the first CMP apparatus. Then, the second polishing pad, which remains on the second CMP apparatus throughout, may be used on such second CMP apparatus for the first, bulk polishing, step regarding the next plurality of wafers, e.g., 3 more lots, totalling 75 wafers (lots 4 to 6), and the third polishing pad may be used on the first CMP apparatus for the second, overpolishing, step regarding the same plurality of wafers (lots 4 to 6).

In turn, after the second polishing pad has become substantially loaded with accumulated CMP residue, e.g., after such 3 lots (lots 4 to 6) have been subjected to the first, bulk polishing, step on the second CMP apparatus, the second polishing pad may be replaced by the fourth polishing pad on the second CMP apparatus. Then, the third polishing pad, which remains on the first CMP apparatus throughout, may be used on the first CMP apparatus for the first, bulk polishing, step regarding the next plurality of wafers, e.g., 3 more lots, totalling 75 wafers (lots 7 to 9), and the fourth polishing pad may be used on the second CMP apparatus for the second, overpolishing, step regarding the same plurality of wafers (lots 7 to 9).

Indeed, the two-step first phase metal CMP process of the invention (FIG. 1A and FIGS. 2A to 2B) achieves the desired polished wafer result without expending consumable materials beyond those otherwise needed, nor does it significantly reduce wafer throughput or product yield.

After the second phase of the CMP process (FIG. 2C), each of the wafers may be subjected to additional processing, such as the deposition of an interlayer dielectric coating on the arrangement of trenches 13 in conventional manner, prior to further processing thereof.

The two-step first phase CMP process of the invention (FIG. 1A and FIGS. 2A to 2B) advantageously permits the achievement of minor (lower) or reduced dishing of metal lines 17 in trenches 13 and minor (lower) or reduced erosion of oxide layer 12 than the prior art one-step first phase CMP process (FIGS. 1A to 1B).

Accordingly, it can be appreciated that the specific embodiments described are merely illustrative of the general principles of the invention. Various modifications may be provided consistent with the principles set forth.

What is claimed is:

1. A chemical mechanical polishing process for minimizing dishing of metal lines formed in trenches in an insulation layer of each of a plurality of semiconductor wafers during fabrication thereof, comprising for each wafer:
    a first, bulk polishing, step of chemically mechanically polishing a metal layer disposed on the insulation layer of the corresponding wafer and having a lower portion located in the trenches of the insulation layer for forming individual metal lines and an upper portion overlying the lower portion;
    the first step polishing being effected with a first polishing pad sufficiently to remove the bulk of the upper portion of the metal layer while generating concomitant chemical mechanical polishing residue, and to leave a minimized remainder of the metal layer upper portion substantially without dishing of the metal layer lower portion in the trenches; and
    a second, overpolishing, step of continuing the polishing with a second polishing pad sufficiently to remove the remainder of the metal layer upper portion with attendant minimized dishing of the metal layer lower portion to an extent for providing the metal lines as individual metal lines correspondingly disposed in the trenches;
    each of the wafers being subjected to the first step polishing with the first polishing pad and thereafter to the second step polishing with the second polishing pad; and
    wherein each of a further plurality of said wafers is subjected to said first and second steps, using said second polishing pad for said first polishing step and a third polishing pad for said second step.

2. The process of claim 1 wherein the second polishing pad has at most a substantially deficient content of prior accumulated chemical mechanical polishing residue prior to being used for said first polishing step.

3. The process of claim 1 wherein the third polishing pad has at most a substantially deficient content of prior accumulated chemical mechanical polishing residue.

4. The process of claim 1 wherein each wafer comprises silicon, the insulation layer comprises silicon dioxide and the metal layer is selected from the group consisting of aluminum, copper and tungsten.

5. The process of claim 1 wherein the insulation layer has a thickness of at least about 300 nm and the metal layer has a thickness of about 200–2000 nm.

6. The process of claim 1 wherein the first step is effected at a downforce of about 2–8 psi for about 30–300 seconds and the second step is effected at a downforce of about 2–8 psi for about 5–50 seconds.

7. The process of claim 1 wherein the a stop layer forming an adhesion promoting diffusion barrier is disposed between the insulation layer and the metal layer.

8. The process of claim 7 wherein each wafer comprises silicon, the insulation layer comprises silicon dioxide, the metal layer is selected from the group consisting of aluminum, copper and tungsten, and the stop layer comprises titanium/titanium nitride.

9. The process of claim 7 wherein the insulation layer has a thickness of at least about 300 nm, the metal layer has a thickness of about 200–2000 nm, and the stop layer has a thickness of about 5–200 nm.

10. The process of claim 7 wherein the first step is effected at a downforce of about 2–8 psi for about 30–300 seconds and the second step is effected at a downforce of about 2–8 psi for about 5–50 seconds.

11. A chemical mechanical polishing process for minimizing dishing of metal lines formed in trenches in an insulation layer of each of a plurality of semiconductor wafers during fabrication thereof, comprising for each wafer:
   a first, bulk polishing, step of chemically mechanically polishing a metal layer disposed on the insulation layer of the corresponding wafer and having a lower portion located in the trenches of the insulation layer for forming individual metal lines and an upper portion overlying the lower portion, a stop layer forming an adhesion promoting diffusion barrier being disposed between the insulation layer and the metal layer and extending into the trenches;
   the first step polishing being effected with a first polishing pad sufficiently to remove the bulk of the upper portion of the metal layer while generating concomitant chemical mechanical polishing residue, and to leave a minimized remainder of the metal layer upper portion, and to expose the portion of the stop layer outwardly of the trenches, substantially without dishing of the metal layer lower portion in the trenches; and
   a second, overpolishing, step of continuing the polishing with a second polishing pad sufficiently to remove the remainder of the metal layer upper portion with attendant minimized dishing of the metal layer lower portion to an extent for providing the metal lines as individual metal lines correspondingly disposed in the trenches;
   each of the wafers being subjected to the first step polishing with the first polishing pad and thereafter to the second step polishing with the second polishing pad; and
   wherein each of a further plurality of said wafers is subjected to said first and second steps, using said second polishing pad for said first polishing step and a third polishing pad for said second step.

12. The process of claim 11 wherein the second polishing pad has at most a substantially deficient content of prior accumulated chemical mechanical polishing residue prior to being used for said first polishing step, and wherein the third polishing pad has at most a substantially deficient content of prior accumulated chemical mechanical polishing residue.

13. The process of claim 11 wherein each wafer comprises silicon, the insulation layer comprises silicon dioxide, the metal layer is selected from the group consisting of aluminum, copper and tungsten, and the stop layer comprises titanium/titanium nitride.

14. The process of claim 11 wherein the insulation layer has a thickness of at least about 300 nm, the metal layer has a thickness of about 200–2000 nm, and the stop layer has a thickness of about 5–200 nm.

15. The process of claim 11 wherein the first step is effected at a downforce of about 2–8 psi for about 30–300 seconds and the second step is effected at a downforce of about 2–8 psi for about 5–50 seconds.

16. A chemical mechanical polishing process for minimizing dishing of metal lines formed in trenches in an insulation layer of each of a plurality of semiconductor wafers during fabrication thereof, comprising for each wafer:
   a first, bulk polishing, step of chemically mechanically polishing a metal layer disposed on the insulation layer of the corresponding wafer and having a lower portion located in the trenches of the insulation layer for forming individual metal lines and an upper portion overlying the lower portion, a stop layer forming an adhesion promoting diffusion barrier being disposed between the insulation layer and the metal layer and extending into the trenches;
   the first step polishing being effected with a first polishing pad sufficiently to remove the bulk of the upper portion of the metal layer while generating concomitant chemical mechanical polishing residue, and to leave a minimized remainder of the metal layer upper portion, and to expose the portion of the stop layer outwardly of the trenches, substantially without dishing of the metal layer lower portion in the trenches; and
   a second, overpolishing, step of continuing the polishing with a second polishing pad sufficiently to remove the remainder of the metal layer upper portion with attendant minimized dishing of the metal layer lower portion to an extent for providing the metal lines as individual metal lines correspondingly disposed in the trenches;
   each of the wafers being subjected to the first step polishing with the first polishing pad and thereafter to the second step polishing with the second polishing pad; and
   wherein each of a further plurality of said wafers is subjected to said first and second steps, using said second polishing pad for said first polishing step and a third polishing pad for said second step;
   each wafer thereafter being subjected to a third polishing step of chemically mechanically polishing the stop layer to remove the portion thereof outwardly of the trenches.

17. The process of claim 16 wherein the second polishing pad has at most a substantially deficient content of prior accumulated chemical mechanical polishing residue prior to being used for said first polishing step, and wherein the third polishing pad has at most a substantially deficient content of prior accumulated chemical mechanical polishing residue.

18. The process of claim 16 wherein each of a still further plurality of said wafers is subjected to said first and second steps, using said third polishing pad for said first polishing step and a fourth polishing pad for said second step.

19. The process of claim 18 wherein the fourth polishing pad has at most a substantially deficient content of prior accumulated chemical mechanical polishing residue.

* * * * *